(12) United States Patent
Igarashi et al.

(10) Patent No.: US 6,972,477 B2
(45) Date of Patent: Dec. 6, 2005

(54) CIRCUIT DEVICE WITH CONDUCTIVE PATTERNS SEPARATED BY INSULATING RESIN-FILLED GROOVES

(75) Inventors: Yusuke Igarashi, Gunma (JP); Nobuhisa Takakusaki, Gunma (JP); Jun Sakano, Gunma (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 3 days.

(21) Appl. No.: 10/733,730

(22) Filed: Dec. 11, 2003

(65) Prior Publication Data

US 2004/0159913 A1 Aug. 19, 2004

(30) Foreign Application Priority Data

Dec. 20, 2002 (JP) ............................ P. 2002-371028

(51) Int. Cl.[7] ............................................. H01L 29/06
(52) U.S. Cl. ..................... 257/622; 257/117; 257/118; 257/466; 257/496; 257/618; 257/619; 257/620; 257/626; 257/647
(58) Field of Search ........................ 257/95, 117, 118, 257/127, 170, 244, 283, 284, 301–305, 330–334, 257/418, 419, 447, 460, 466, 496, 534, 571, 257/586, 374, 618–628, 510–521, 396–398

(56) References Cited

U.S. PATENT DOCUMENTS 5,306,872 A * 4/1994 Kordus et al. .............. 174/250
2003/0017645 A1 * 1/2003 Kabayashi et al. ......... 438/106

FOREIGN PATENT DOCUMENTS

JP 2002-76246 3/2002

* cited by examiner

Primary Examiner—Andy Huynh
(74) Attorney, Agent, or Firm—Fish & Richardson P.C.

(57) ABSTRACT

To make thin a circuit device 10 in which are incorporated a plurality of types of circuit elements 12 that differ in thickness, first conductive patterns, onto which comparatively thin circuit elements 12A are mounted, are formed thickly, and second conductive patterns 11B, onto which comparatively thick second circuit elements 12B are mounted, are formed thinly. Also, fine wiring parts may be formed using the thinly formed second conductive patterns 12B. Thus even in the case where thick circuit elements are incorporated, by affixing such circuit elements onto the thinly formed second conductive patterns 11B, the total thickness can be made thin. Thinning of circuit device 10 as a whole can thus be accomplished.

14 Claims, 9 Drawing Sheets

CIRCUIT DEVICE WITH CONDUCTIVE PATTERNS SEPARATED BY INSULATING RESIN-FILLED GROOVES

BACKGROUND OF THE INVENTION

1. Field of the Invention

This invention relates to a circuit device and a manufacturing method thereof and particularly relates to a circuit device, with which conductive patterns, onto which comparatively thin elements are mounted, are formed thickly and conductive patterns, onto which circuit elements with thickness are mounted, are formed thinly to enable the device as a whole to be made thin, and a method for manufacturing such a circuit device.

2. Description of the Related Art

Conventionally, due to being employed in portable telephones, portable computers, etc., circuit devices that are set in electronic equipment have been demanded to be compact, thin, and lightweight.

Recently, as general semiconductor devices called CSP (chip size packages), wafer-scale CSP of sizes equivalent to chips and CSP of sizes slightly larger than chips have been developed.

FIG. 13 shows a CSP 66, which is slightly larger than a chip size and employs a glass epoxy substrate 65 as the supporting substrate. Here, a description shall be provided for the case where a transistor chip T is mounted onto glass epoxy substrate 65.

On the surface of this glass epoxy substrate 65, a first electrode 67, a second electrode 68, and a die pad 69 are formed. A first rear surface electrode 70 and a second rear surface electrode 71 are formed on the rear surface of this glass epoxy substrate 65. Via through holes TH, the first electrode 67 is electrically connected with first rear surface electrode 70 and second electrode 68 is electrically connected with second rear surface electrode 71. The transistor chip T is affixed in bare form onto die pad 69, the emitter electrode of the transistor is connected via a metal wire 72 to first electrode 67, and the base electrode of the transistor is connected via a metal wire 72 to second electrode 68. Furthermore, a resin layer 73 is provided on glass epoxy substrate 65 so as to cover transistor chip T.

Though employing a glass epoxy substrate 65, the CSP 66, unlike a wafer-scale CSP, has the merits of being simple in the extension structure from chip T to the rear surface electrodes 70 and 71 for external connection and being inexpensive to manufacture.

However, the above-described CSP 66 uses a glass substrate 65 as an interposer and this places on limit on making CSP 66 more compact and thinner. A circuit device 80, with which such a mounting substrate is made unnecessary as shown in FIG. 14, has thus been developed.

As shown in FIG. 14, circuit device 80 comprises conductive patterns 81, circuit elements 82 affixed onto conductive patterns 81, metal wires 84, electrically connecting circuit elements 82 and conductive patterns 81, and an insulating resin 83, covering circuit elements 82 and conductive patterns 81 while exposing the rear surfaces of conductive patterns 81. Circuit device 80 is thus arranged so that a mounting substrate is unnecessary and is formed more thinly and more compactly in comparison to CSP 66.

However, with the above-described circuit device 80, conductive patterns 81 are formed to a uniform thickness. Thus in a case where various types of circuit elements 82 that differ in thickness are affixed onto conductive patterns 81, insulating resin 83 is formed thickly so that circuit elements 82 with thickness will be covered. Circuit device 80 thus became thick as a whole and this placed a limit on making the circuit device lightweight and compact.

Also, if in the case where conductive patterns 81 are made thin to make the device thin, a circuit element 82 is an element that accompanies the generation of heat, the transient thermal resistance becomes large.

This embodiment of invention has been made in view of the above problems, and one of objects of this embodiment is to provide a circuit device, with which the increase of the thickness of the circuit device as a whole can be restrained even when a comparatively thick circuit element is incorporated, and a method for manufacturing such a circuit device.

SUMMARY OF THE INVENTION

A circuit device of this embodiment comprises: first conductive patterns, separated by first separation grooves; second conductive patterns, formed more thinly than the first conductive patterns and separated by second separation grooves; first circuit element, affixed onto the first conductive patterns; second circuit element, affixed onto the second conductive patterns; and an insulating resin, covering the circuit element and the conductive patterns while leaving rear surfaces of both of the conductive patterns exposed and filling both of the separation grooves.

A circuit device of this embodiment comprises: first conductive patterns, separated by first separation grooves; second conductive patterns, formed more thinly than the first conductive patterns, separated by second separation grooves, and forming wiring; circuit element, affixed onto the first conductive patterns; and an insulating resin, covering the circuit element and the conductive patterns while leaving the rear surfaces of both of the conductive patterns exposed and filling both of the separation grooves.

A circuit device manufacturing method of this embodiment comprises: preparing a conductive foil; coating a first resist onto the top surface of the conductive foil; performing etching while leaving on the first resist at regions at which first conductive patterns are to be formed to thereby form first separation grooves that separate the first conductive patterns and furthermore depressing the conductive foil uniformly at regions at which second conductive patterns are to be formed; covering the top surfaces of the first conductive patterns and the top surface of the conductive foil at regions at which the second conductive patterns are to be formed with a second resist and performing etching to form the first separation grooves deeply and form second separation grooves that separate the second conductive patterns; affixing circuit elements onto both or either of the first conductive patterns and the second conductive patterns; forming an insulating resin so as to cover the circuit element and fill both of the separation grooves; and removing a rear surface of the conductive foil until the insulating resin filled in both of the separation grooves becomes exposed.

By forming the second conductive patterns more thinly than the first conductive patterns and affixing thick circuit elements onto the second conductive patterns, the device as a whole can be formed thinly. Also, by affixing elements that accompany the generation of heat onto the thickly formed first conductive patterns, the transient heat resistance can be made small.

With circuit device of this embodiment, thin first circuit elements 12B are affixed onto first conductive patterns 11A that have thickness. And thick circuit elements 12B are mounted onto second conductive patterns 11B that are formed more thinly than first conductive patterns 11A. Thus, the total thickness, which is the sum of the thickness of conductive patterns 11 and circuit elements 12 that are affixed on top, can be reduced. Further thinning of the entirety of circuit device 10 can thus be realized.

Furthermore, by mounting elements that accompany the generation of heat, such as power semiconductor elements, etc., onto the thickly formed first conductive patterns 11A, first conductive patterns 11A can be made to function as a heat sink to reduce the transient thermal resistance.

Yet furthermore, since fine wiring parts can be formed by thin second conductive patterns 11B, a circuit device 10B, having first conductive patterns 11A that function as a heat sink and second conductive patterns 11B that form wiring parts, can be provided.

With circuit device manufacturing method of this embodiment, by etching conductive foil 40 using first resist PR2, first separation grooves 16A are formed and regions of conductive foil 40 at which second conductive patterns 11B are to be formed are made thin uniformly. By then etching conductive foil 40 again using second resist PR2, first separation grooves 16A are made deep and second separation grooves 16A are formed. Thick first conductive patterns 11A, which are separated by first separation grooves 16A, and thin second conductive patterns 11B, which are separated by second separation grooves 16B, can thus be formed.

DESCRIPTION OF THE PREFERRED EMBODIMENTS

First Embodiment for Describing the Configuration of a Circuit Device

Figure 1A:
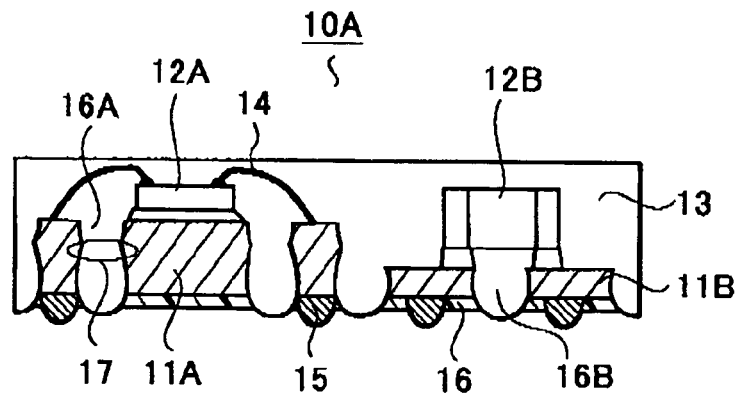
FIG. 1 is a sectional view (A) and a plan view (B) showing a circuit device of preferred embodiment.
Figure 1B:
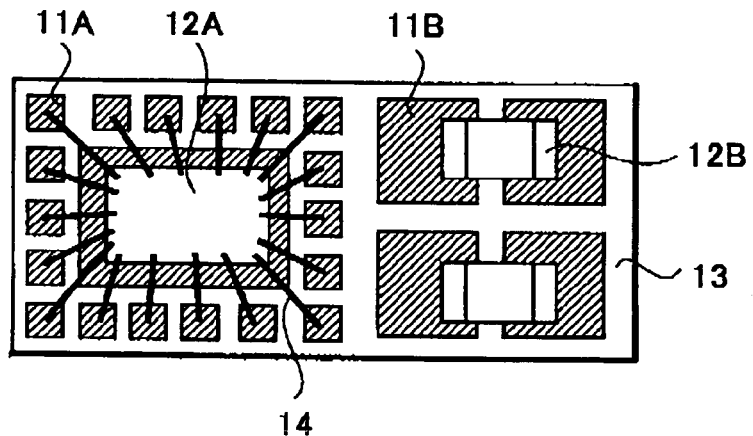

Referring now to FIG. 1, a circuit device 10A has first conductive patterns 11A, formed thickly and separated by first separation grooves 16A; second conductive patterns 11B, formed more thinly than first conductive patterns 11A and separated by second separation grooves 16B; a first circuit element 12A, affixed onto a first conductive pattern 11A; second circuit elements 12B, affixed onto second conductive patterns 11B; and an insulating resin 13, covering circuit elements 12 and conductive patterns 11 while leaving the rear surfaces of both conductive patterns 11 exposed and filling both separation grooves 16. Such an configuration shall now be described in detail. FIG. 1(A) is a sectional view of circuit device 10A and FIG. 1(B) is a plan view of the same.

The material of first conductive patterns 11A is selected in consideration of brazing material attachment property, bonding property, and plating property, and as this material, a conductive foil having Cu as the principal material, a conductive foil having Al as the principal material, or a conductive foil formed of an alloy, such as Fe—Ni, etc., is employed. Here, first conductive patterns 11A are of a structure in which they are embedded in insulating resin 13 with their rear surfaces exposed and are electrically separated by first separation grooves 16A. In terms of thickness, first conductive patterns 11A are formed thicker than second conductive patterns 11B and, for example, are formed to a thickness of 140 μm or more. Also, external electrodes 15, formed of soft solder or other brazing material, are disposed on the rear surfaces of first conductive patterns 11A that are exposed from insulating resin 13.

Furthermore, first conductive patterns 11A are electrically separated by first separation grooves 16. Since at least one constricted part 17 is provided at a side part of each first separation groove 16A, the adhesion of first conductive patterns 11A to insulating resin 13 is made firm. Here, first conductive pattern 11A forms an island, on the top surface of which the first circuit element is mounted, and bonding pads, which are electrically connected with first circuit element 12A via metal wires 14. At the rear surface of the device, a resist 16 covers locations at which external electrodes 15 are not disposed.

Second conductive patterns 11B are formed of the same material as the above-described first conductive patterns 11A. And second conductive patterns are formed more thinly than first conductive patterns 11A. Furthermore, since the rear surfaces of first conductive patterns 11A and the rear surfaces of second conductive patterns 11B are on the same plane, the top surfaces of first conductive patterns 11A are formed higher than the top surfaces of second conductive patterns 11B. Though here, second conductive patterns 11B have second circuit elements 12B with thickness affixed thereon, these conductive patterns may also form fine wiring parts. Specifically, the thickness of second conductive patterns 11B is, for example, approximately 50 μm. Yet furthermore, first conductive patterns 11A and second conductive patterns 11B may be electrically connected via wiring parts.

Here, a semiconductor element is employed as first circuit element 12A and is affixed in a face-up manner onto the island formed of a first conductive pattern 11A. The electrodes of first circuit element 12A are electrically connected via metal wires 14 to the bonding pads formed of first conductive patterns 11A. As mentioned above, since first conductive patterns 11A are formed thickly, even if first circuit element 12A is an element that accompanies the generation of heat (for example, a power semiconductor element), first conductive patterns 11A function as a heat sink and can reduce the transient thermal resistance. Also as a specific example, a high current type semiconductor element may be employed as first circuit element 12A. In the case of a high current type semiconductor element, a large amount of heat is generated during operation. The thick first conductive patterns are thus advantageous for promoting the dissipation of the heat generated by a first circuit element 12A that is such a high current type semiconductor element.

As second circuit elements 12B, chip elements with thickness, such as chip resistors or chip capacitors, etc., are employed here, and these are affixed onto second conductive patterns 11B via soft solder or other type of conductive adhesive agent. In particular, in the case where a high current type semiconductor element is employed as the above-described first circuit element 12A, capacitors of large capacity will be required in the vicinity as a countermeasure against noise. Such large capacity capacitors are generally formed to have a high height. Thus by affixing such large capacity capacitors with a high height onto the second conductive patterns that are thinner than first conductive patterns 11A, the thickness of circuit device 10A as a whole can be made thin.

Insulating resin 13 covers circuit elements 12, metal wires 14 and conductive patterns 11 while leaving exposed the rear surfaces of first conductive patterns 11A and second conductive patterns 11B. A thermosetting resin or a thermoplastic resin may generally be used as insulating resin 13. Insulating resin 13 also fills separation grooves 16 that separate the respective conductive patterns 11. Furthermore, the entirety of this circuit device of embodiment 10A is supported by insulating resin 13.

The merits of having first conductive patterns 11A and second conductive patterns 11B that differ in thickness as described above shall now be described. A thin first circuit element 12A is affixed onto a first conductive pattern 11B that is formed comparatively thickly. Thick circuit element 12B is mounted onto second conductive patterns 11B that are formed more thinly than first conductive patterns 11A. Thus even if a plurality of types of circuit elements 12 that differ in thickness are to be incorporated in circuit device 10A, by mounting thick circuit elements 12B onto the thinly formed second conductive patterns 11B, the thickness of the entirety can be kept low. Furthermore, the heights of both conductive patterns can be adjusted so that the sum height of the height of first conductive patterns 11A and the height of first circuit element 12A will be approximately equal to the sum height of the height of second conductive patterns 11B and the height of second circuit elements 12B. The thickness of insulating resin 13 that covers these parts can thereby be minimized and thus the thickness of the device as a whole can be made thin.

First separation grooves 16A are formed between first conductive patterns 11A by a plurality of times of etching. At least one constricted part 17 is formed at a middle part of side surface of first separation groove. At constricted parts 17, the width in the lateral direction is made narrower than other parts of first separation grooves 16A. Since the side surfaces of constricted parts 17 correspond to the side surfaces of first conductive patterns 11A, the adhesion of insulating resin 13 to constricted parts 17 improves the strength of adhesion of insulating resin 13 to first conductive patterns 11A. As mentioned above, first separation grooves 16A are formed by etching the same locations of the conductive foil that is the material of conductive patterns 11 a plurality of times. First separation grooves 16A are thus formed to be greater in their depth than in their width. Also, constricted parts 17 are formed continuously across all side surface parts of first separation grooves 16A.

Here, since first separation grooves 16A are formed by two times of etching, the depth of separation grooves 16A is approximately twice their width. In the case where first separation grooves 16A are formed by an even greater number of times of etching, the depth thereof can be made even deeper with respect to their width. Also, since the thickness of first conductive patterns 11A corresponds to the depth of first separation grooves 16A, first conductive patterns 11A that are formed more thickly than the width of first separation grooves 11A can be formed by the preferred embodiment of the present invention.

Figure 2:
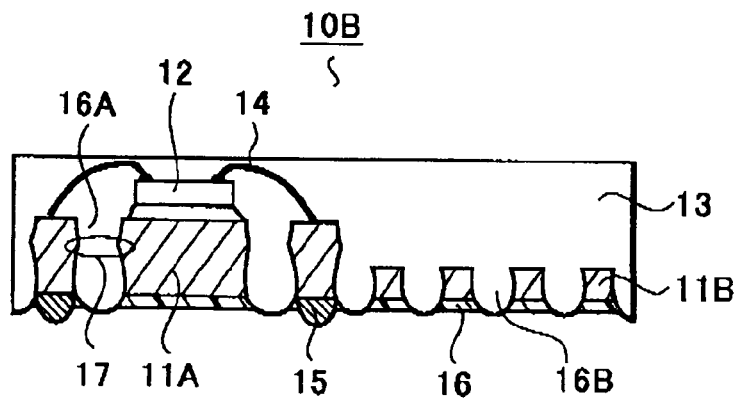
FIG. 2 is a sectional view showing a circuit device of preferred embodiment.

The configuration of circuit device 10B of another embodiment shall now be described with reference to FIG. 2. Circuit device 10B has first conductive patterns 11A, formed thickly and separated by first separation grooves 16A, second conductive patterns 11B, formed more thinly than first conductive patterns 11A, separated by second separation grooves 16B, and forming fine wiring, a circuit element 12, which is affixed onto a first conductive pattern 11A, and insulating resin 13, covering circuit element 12 and conductive patterns 11 and filling both separation grooves 16 while leaving the rear surfaces of both conductive patterns 11 exposed.

Circuit device 10B, with the above-described configuration, differs from circuit device 10A in that second conductive patterns 11B form fine wiring. Specifically, since second conductive patterns 11B can be formed to be as thin as approximately 50 μm, a fine wiring structure can be realized by etching. The first conductive patterns 11A, which are formed thickly to function as a heat sink for a circuit element 12 that accompanies the generation of heat, and second conductive patters 11B, which form-fine wiring, can thus be formed in the the same circuit device 10B. Second conductive patterns 11B can also be formed so as to be electrically continuous with first conductive patterns 11B. Also, as circuit element 12, the same element as first circuit element 12A of FIG. 1 may be employed.

Second Embodiment for Describing a Manufacturing Method

A method for manufacturing a circuit device 10 shall now be described with reference to FIG. 3 to FIG. 11. This circuit device manufacturing method of this embodiment comprises the steps of: preparing a conductive foil 40 and coating a first resist PR1 onto the top surface of conductive foil 40; performing etching while leaving on first resist PR1 at regions at which first conductive patterns 11A are to be formed to thereby form first separation grooves 16A that separate first conductive patterns 11A and furthermore depressing conductive foil 40 uniformly at regions at which second conductive patterns 11B are to be formed; covering at least the top surfaces of first conductive patterns 11A and the top surface of conductive foil 40 at regions at which second conductive patterns 11B are to be formed with a second resist PR2 and performing etching to form first separation grooves 11A deeply and form second separation grooves 16B that separate second conductive patterns 11B; affixing circuit elements 12 onto both or either of first conductive patterns 11A and said second conductive patterns 11B; forming an insulating resin 13 so as to cover circuit elements 12 and fill both separation grooves 16; and removing the rear surface of conductive foil 40 until the insulating resin 13 filled in both separation grooves 16 becomes exposed. The respective steps mentioned above shall now be described in detail.

Figure 3:
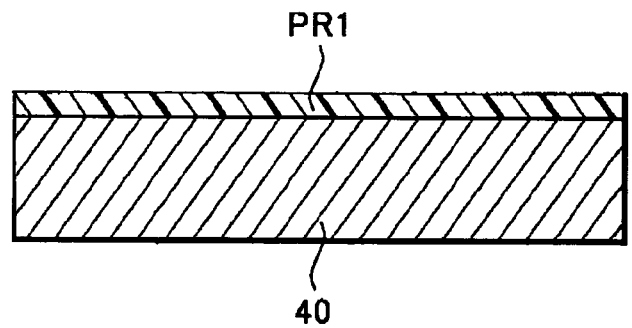
FIG. 3 is a sectional view showing a circuit device manufacturing method of preferred embodiment.
Figure 4:
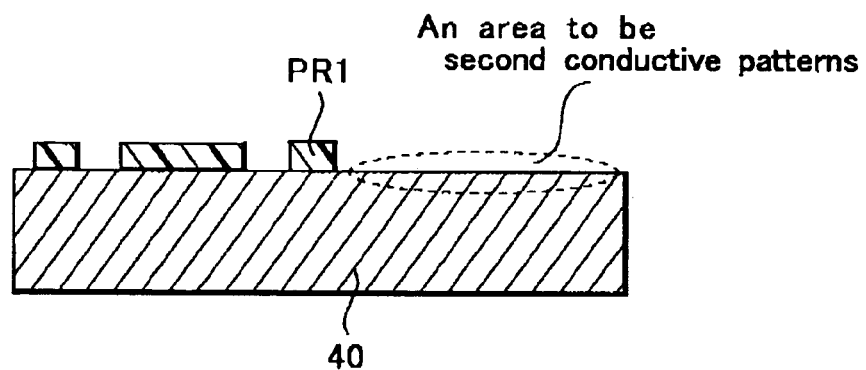
FIG. 4 is a sectional view showing a circuit device manufacturing method of preferred embodiment.
Figure 5:
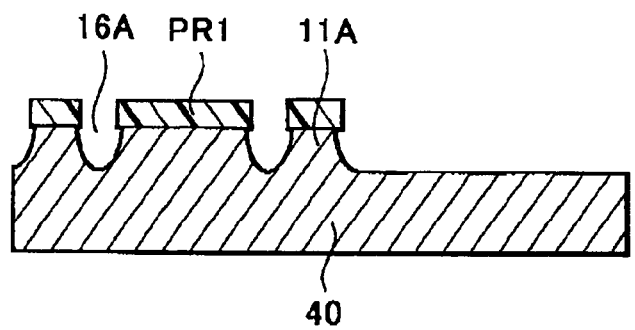
FIG. 5 is a sectional view showing a circuit device manufacturing method of preferred embodiment.

As shown in FIG. 3 to FIG. 5, in the first step of this embodiment, a conductive foil 40 is prepared, a first resist PR1 is coated onto the top surface of conductive foil 40, and by performing etching while leaving first resist PR1 on at regions at which first conductive patterns 11A are to be formed, first separation grooves 16A that separate first conductive patterns 11A are formed, and furthermore, conductive foil 40 is depressed uniformly at regions at which the second conductive patterns 11B are to be formed.

In this step, first, a sheet-form conductive foil 40 is prepared as shown in FIG. 3. The material of this conductive foil 40 is selected in consideration of brazing material attachment property, bonding property, and plating property. As this material, a conductive foil having Cu as the principal material, a conductive foil having Al as the principal material, or a conductive foil formed as an alloy, such as Fe—Ni, etc., is employed. In consideration of subsequent etching, the thickness of the conductive foil is preferable approximately 10 $\mu$m to 300 $\mu$m.

Referring now to FIG. 4, a first resist PR1, which is an etch-resistant mask, is formed on the top surface of conductive foil 40, and first resist PR1 is patterned so that conductive foil 40 is exposed at regions except regions that are to become first conductive patterns 11A. The top surface of conductive foil 40 is also exposed at regions that are to become second conductive patterns 11B so that these regions will be formed thinly as well.

Then by performing etching, first separation grooves 16A are formed as shown in FIG. 5. Separation grooves 16A, which are formed by etching, are for example 50 $\mu$m in depth and since the side surfaces thereof are rough surfaces, the adhesion to insulating resin 13 is improved. Here, ferric chloride or cupric chloride is mainly employed as the etchant, and the abovementioned conductive foil is dipped in this etchant or is showered with this etchant. Since generally with wet etching, etching is performed in a non-anisotropic manner, the side surfaces become curved structures. The regions of conductive foil 40 that are to become second conductive patterns 11B are also etched to approximately the same depth as that of first separation grooves 16A and the top surfaces of these regions become basically flat.

Figure 6:
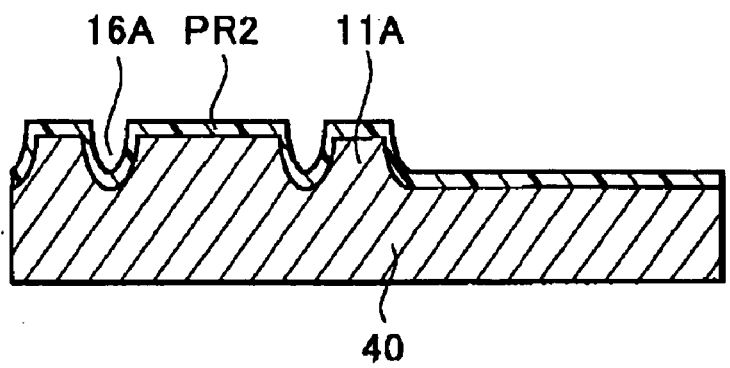
FIG. 6 is a sectional view showing a circuit device manufacturing method of preferred embodiment.

In the second step of this embodiment, at least the top surfaces of first conductive patterns 11A and the top surface of conductive foil 40 at regions at which second conductive patterns 11B are to be formed are covered with a second resist PR2 and etching is performed to form first separation grooves 16A deeply and form second separation grooves 16B that separate second conductive patterns 11B as shown in FIG. 6 to FIG. 8.

First, as shown in FIG. 6, after peeling and removing first resist PR1, second resist PR2 is formed on the top surface of conductive foil 40, including the surfaces of first separation grooves 16A.

Figure 7A:
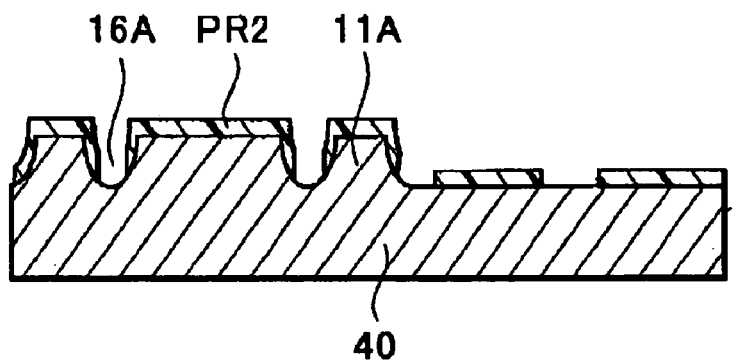
FIG. 7 is a sectional view (A) and a sectional view (B) showing a circuit device manufacturing method of preferred embodiment.

Then as shown in FIG. 7(A), second resist PR2 is exposed and developed to expose the bottom portion of first separation grooves 16A and the top surface of conductive foil 40 at regions that are to become second separation grooves 16B that separate second conductive patterns 11B. With regard to first separation grooves 16A, second resist PR2 is attached to a part of the sides thereof as well.

Figure 7B:
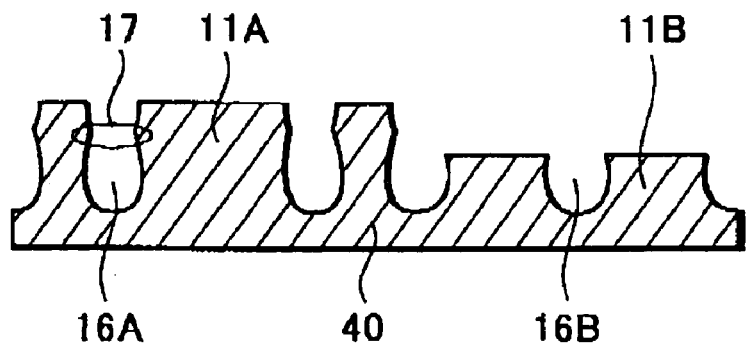

Then as shown in FIG. 7(B), by etching the parts of conductive foil 40 that are exposed from second resist PR2, first separation grooves 16A are made deeper and second separation grooves 16B are formed in convex shape. By the etching progressing in an isotropic manner from the bottom surfaces of first separation grooves 16A that are exposed from second resist PR2, first separation grooves 16A are formed deeply and constricted parts 17 are formed near the middle part in the depth direction thereof. By thus forming first separation grooves 16A by etching a plurality of times, constricted parts 17, which are formed narrower in width than other parts, can be formed. Furthermore, deep separation grooves can be formed that have a width equivalent to that of separation grooves formed by etching once. First conductive patterns 11A can thus be formed thickly without widening the width of first separation grooves 16A.

A method for forming fine wiring parts by means of second conductive patterns 11B in this step shall now be described with reference to FIG. 8.

Figure 8A:
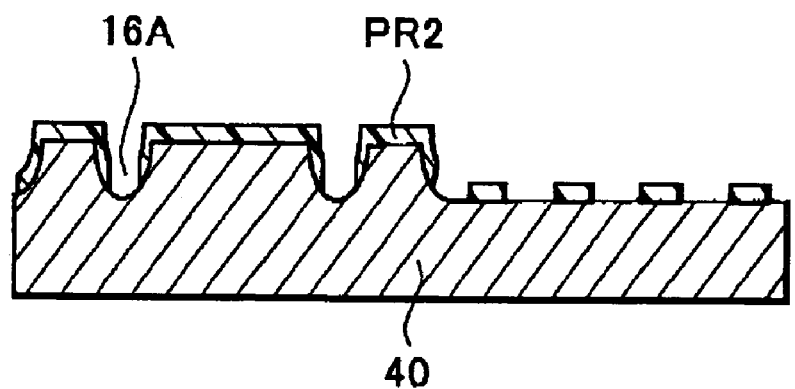
FIG. 8 is a sectional view (A) and a sectional view (B) showing a circuit device manufacturing method of preferred embodiment.

First, as shown in FIG. 8(A), the side surface of first separation grooves 16A and parts at which second conductive patterns 11B are to be formed are covered with second resist PR2. Here, second resist PR2 is formed finely so that fine wiring parts can be formed by second conductive patterns 11B.

Figure 8B:
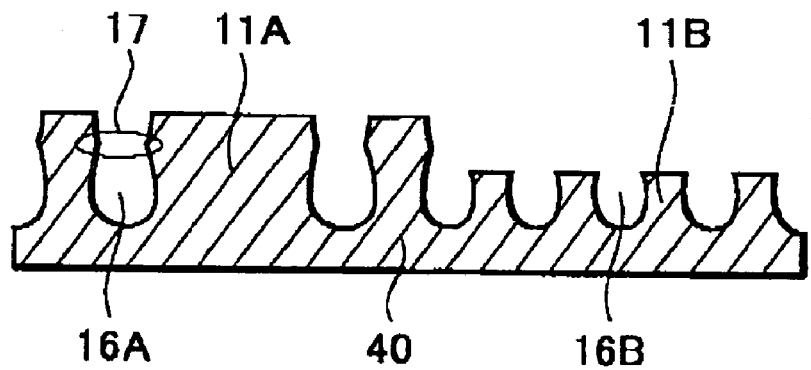

Then by performing etching as shown in FIG. 8(B), first separation grooves 16A are made deeper and second separation grooves 16B are formed. Since in the above-described first step, conductive foil 40 is formed thinly at regions at which second conductive patterns 11B are to be formed, fine wiring parts can be formed by second conductive patterns 11B. Here, the mutual interval between the second conductive patterns can, for example, be made approximately 50 $\mu$m.

In the third step of this embodiment, circuit elements 12 are affixed onto both or either of first conductive patterns 11A and second conductive patterns 11B.

Figure 9A:
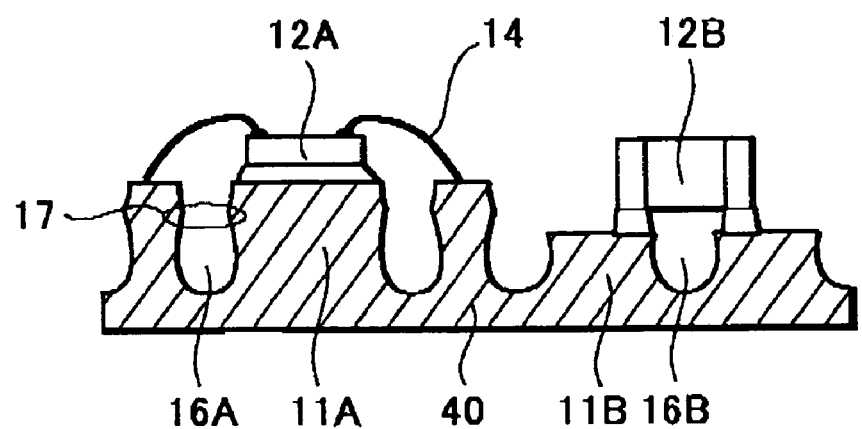
FIG. 9 is a sectional view (A) and a sectional view (B) showing a circuit device manufacturing method of preferred embodiment.

Referring now to FIG. 9(A), circuit elements 12 are mounted onto both of first conductive patterns 11A and second conductive patterns 11B here. Preferably, a thin circuit element 12A is mounted onto a thickly formed first conductive pattern 11A and a thick second circuit element 12B is mounted onto a second conductive pattern that is formed more thinly than first conductive pattern 11A. Here, a first circuit element 12A, which is a semiconductor element, is affixed in a face-up manner onto an island formed of a first conductive pattern 11A. The electrodes on the top surface of first circuit element 12A are electrically connected by metal wires 14 to the first conductive patterns 11A that are boding pads. Here, second circuit element 12B is a chip resistor, chip capacitor, or other chip element and is affixed onto a conductive pattern 11B by soft solder or other brazing material. Here for example, a high current type semiconductor element may be employed as first circuit element 12A. And for example, a chip capacitor may be employed as second circuit element 12B.

Figure 9B:
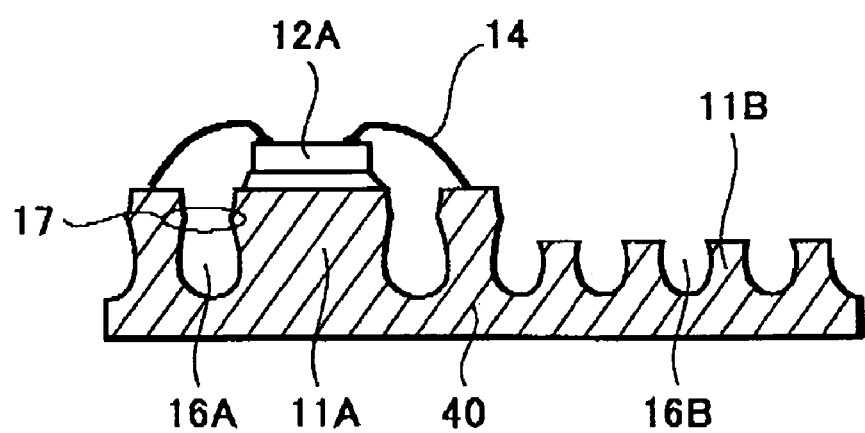

Referring now to FIG. 9(B), since second conductive patterns 11B form fine wiring parts here, a circuit element 12 is mounted only onto a first conductive pattern 11A. The same type of circuit element as the above-described circuit element 12 may be employed as circuit element 12 here.

In the fourth step of this embodiment, insulating resin 13 is formed so as to cover circuit elements 12 and fill both separation grooves 16 as shown in FIG. 10.

Figure 10A:
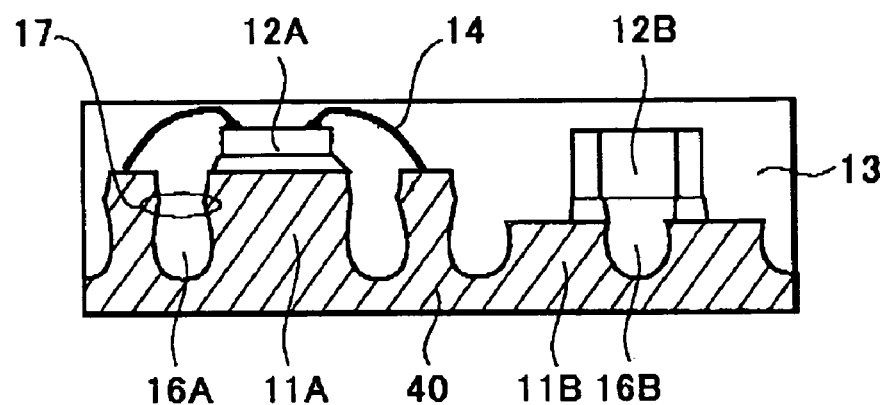
FIG. 10 is a sectional view (A) and a sectional view (B) showing a circuit device manufacturing method of preferred embodiment.

Referring now to FIG. 10(A), insulating resin 13 covers circuit elements 12 and the plurality of conductive patterns 11, and in separation grooves 16 between conductive patterns 11, insulating resin 13 is filled to fit and bind strongly with the curved structures of the side surfaces of conductive patterns 11. Conductive, patterns 11 are thus supported by insulating resin 13.

Also, since constricted parts 17, at which the width is made narrow, are formed in first separation grooves 16A and insulating resin 13 adheres closely to constricted parts 17, the adhesion of insulating resin 13 to conductive patterns 11 is made strong. This step maybe realized by transfer molding, injection molding, or dipping. With regard to the resin material, an epoxy resin or other thermosetting resin may be used for transfer molding, or a polyimide resin, polyphenylene sulfide, or other thermoplastic resin maybe used for injection molding.

A merit of this step is that until covering by insulating resin 13 is performed, conductive foil 40, which is to become conductive patterns 11, is the supporting substrate. Though in the related art, conductive paths are formed by employing an inherently unnecessary supporting substrate, with the preferred embodiment, conductive foil 40, which serves as the supporting substrate, is a material that is necessary as an electrode material. The merit of enabling work to be performed while eliminating the component materials as much as possible is thus provided and cost reduction can also be realized.

Furthermore, the thick second circuit element 12B is affixed onto the thinly formed second conductive pattern 11B. The uppermost part of second circuit element 12B is therefore approximately the same in height as the uppermost part of first circuit element 12A. Thus even when such a thick circuit element 12A is incorporated, extra increase of the thickness of insulating resin 13, which covers the circuit elements, can be restrained.

Figure 10B:
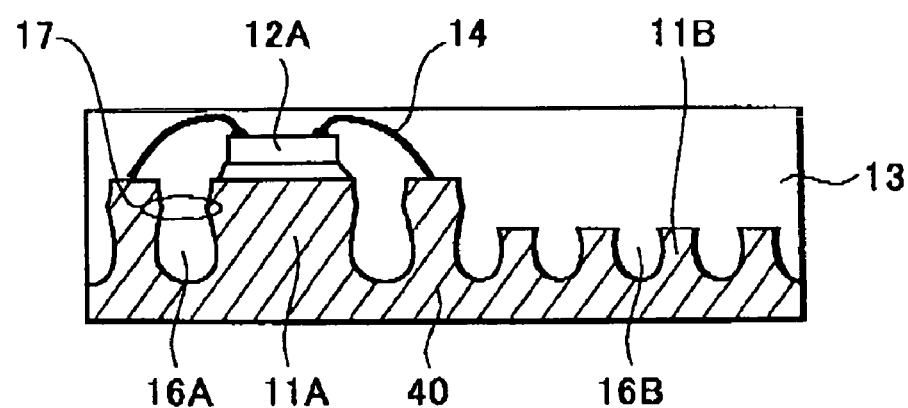

Referring now to FIG. 10(B), here, second conductive patterns 11B form fine wiring parts and insulating resin 13 fills second separation grooves 16B that separate second conductive patterns 11B.

In the fifth step of this embodiment, the rear surface of conductive foil 40 is removed until the insulating resin 13 that is filled in both separation grooves 16 becomes exposed as shown in FIG. 11.

Figure 11A:
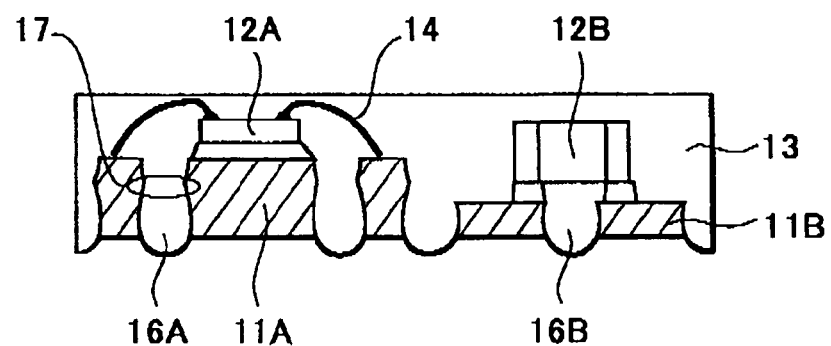
FIG. 11 is a sectional view (A) and a sectional view (B) showing a circuit device manufacturing method of preferred embodiment.

Referring now to FIG. 11(A), here, the rear surface of conductive foil 40 is removed until the insulating resin 13 filled in first and second separation grooves 16A and 16B becomes exposed to thereby separate the respective conductive patterns 11. In this step, the rear surface of conductive foil 40 is removed chemically and/or physically to separate it into conductive patterns 11. This step is carried out by lapping, grinding, etching, metal vaporization by a laser, etc. Since first separation grooves 16A are formed deeply, first conductive patterns 11A can also be formed deeply here. Specifically, the conductive patterns can be formed thickly to approximately 150 $\mu$m.

Figure 11B:
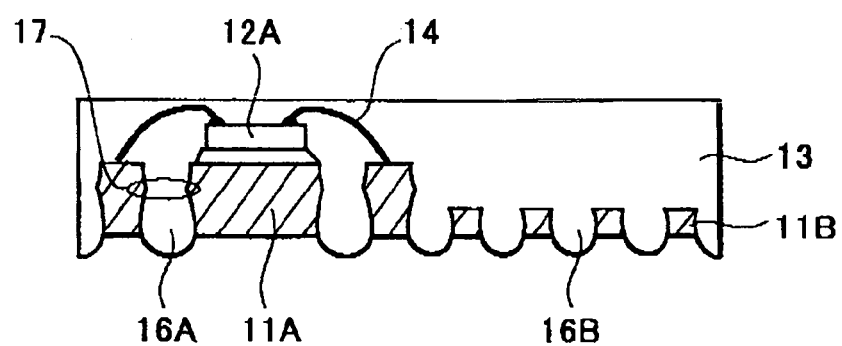

Referring now to FIG. 11(B), second conductive patterns 11B that form fine wiring parts are electrically separated by the same method as that described above. Since at regions at which second conductive patterns 11B are formed, conductive foil 40 is made adequately thin in the above-described first step, fine wiring parts can be formed.

After this step is completed, the rear surfaces of conductive patterns 11 are covered by a resist 16 and external electrodes 15 are formed at desired locations. Also, by dicing insulating resin 13 at the boundary parts of the respective circuit devices 10 that are formed in matrix form, separation into individual circuit devices 10 is performed. Through the above-described steps, a circuit device 10, such as shown in FIG. 1 or 2 is manufactured.

Figure 12A:
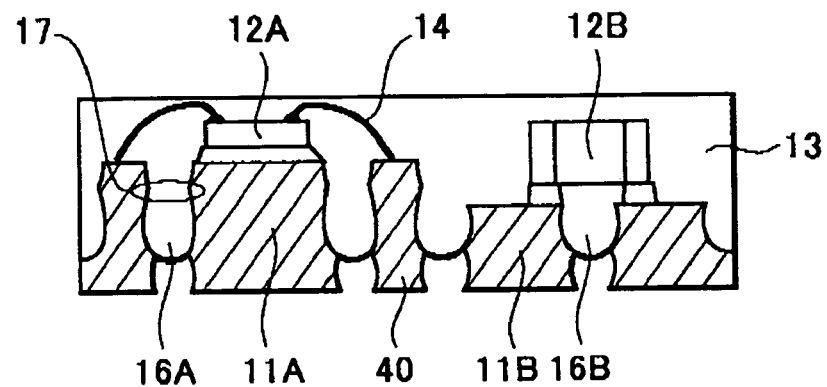
FIG. 12 is a sectional view (A) and a sectional view (B) showing a circuit device manufacturing method of preferred embodiment.
Figure 12B:
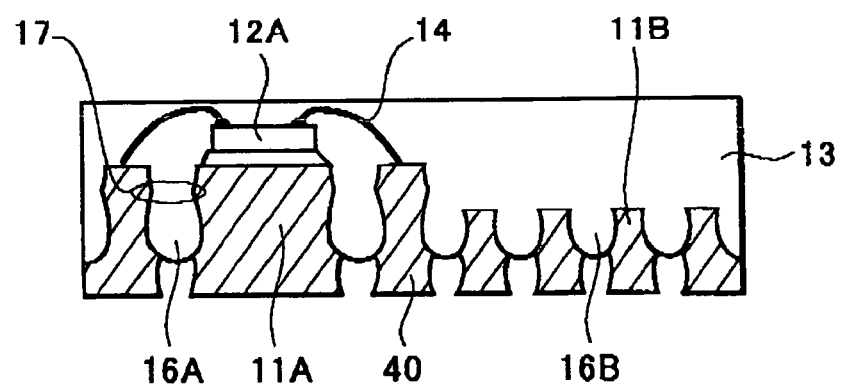
Figure 13:
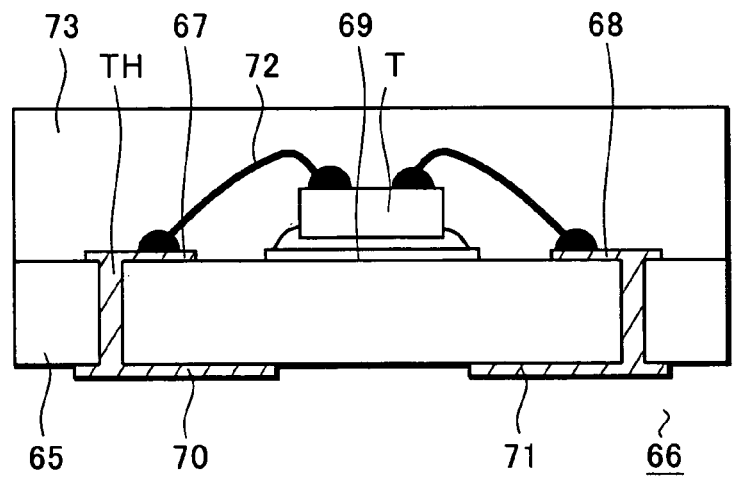
FIG. 13 is a sectional view showing a related-art circuit device.
Figure 14:
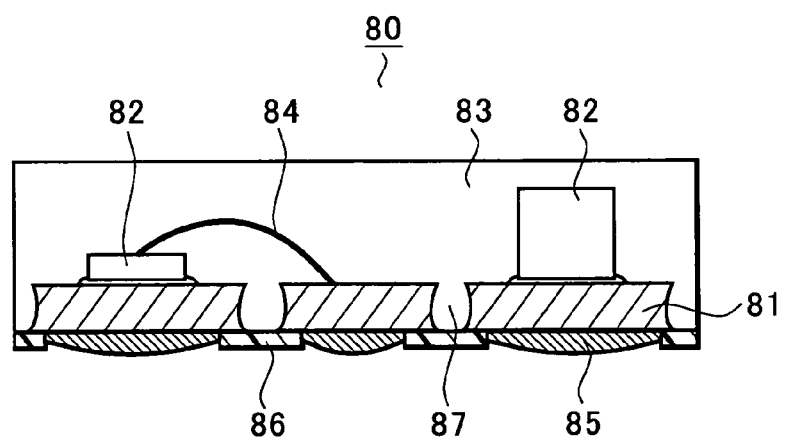
FIG. 14 is a sectional view showing a related-art circuit device.

The respective conductive patterns 11 can be separated by partially removing the rear surface of conductive foil 40 as shown in FIG. 12(A) and FIG. 12(B). Here, partial removal of the rear surface of conductive foil 40 is performed by selectively covering the rear surface of conductive foil 40 with a resist, etc., and then performing etching. The partially removed regions of conductive 40 correspond to the regions at which separation grooves 16 are formed. By separating the respective conductive patterns 11 by such a partial removal method, the thickness of conductive patterns 11 can be made thick. The thermal radiation property of the circuit device as a whole can thereby be improved.

What is claimed is:

1. A circuit device comprising:
   first conductive patterns, separated by first separation grooves;
   second conductive patterns, formed more thinly than the first conductive patterns and separated by second separation grooves;
   first circuit element, affixed onto the first conductive patterns;
   second circuit element, affixed onto the second conductive patterns; and
   an insulating resin, covering the circuit element and the conductive patterns while leaving rear surfaces of both of the conductive patterns exposed and filling both of the separation grooves.

2. The device of claim 1, wherein top surfaces of the first conductive patterns are formed higher than top surfaces of the second conductive patterns.

3. The device of claim 1, wherein at least one constricted part is provided at a side part of each separation groove that separates the first conductive patterns.

4. The device of claim 1, wherein the second circuit elements are thicker than the first circuit elements.

5. The device of claim 1, wherein a sum height of a height of the first circuit element and a height of the first conductive patterns is made equivalent to a sum height of a height of the second circuit element and a height of the second conductive patterns.

6. The device of claim 1, wherein the first circuit element comprises a semiconductor element.

7. The device of claim 1, wherein the first circuit element is an element that generates heat.

8. The device of claim 1, wherein the second circuit element comprises a chip capacitor.

9. The device of claim 1, wherein wiring parts are formed by the second conductive patterns.

10. A circuit device comprising:
    first conductive patterns, separated by first separation grooves;
    second conductive patterns, formed more thinly than the first conductive patterns, separated by second separation grooves, and forming wiring;
    circuit element, affixed onto the first conductive patterns; and
    an insulating resin, covering the circuit element and the conductive patterns while leaving the rear surfaces of both of the conductive patterns exposed and filling both of the separation grooves.

11. The device of claim 10, wherein top surfaces of the first conductive patterns are formed higher than top surfaces of the second conductive patterns.

12. The device of claim 10, wherein at least one constricted part is provided at a side part of each separation groove that separates the first conductive patterns.

13. The device of claim 10, wherein the circuit element comprises a semiconductor element.

14. The device of claim 10, wherein the circuit element is an element that generates heat.

\* \* \* \* \*